(12) United States Patent
Yan et al.

(10) Patent No.: US 9,178,350 B2
(45) Date of Patent: Nov. 3, 2015

(54) ELECTRIC DISTRIBUTION SYSTEM PROTECTION

(75) Inventors: Pan Yan, Niskayuna, NY (US); Reigh Allen Walling, Clifton Park, NY (US); Amol Rajaram Kolwalkar, Karnataka (IN); Michael Lewis Reichard, Schenectady, NY (US); Wei Ren, Niskayuna, NY (US); Swakshar Ray, Guilderland, NY (US)

(73) Assignee: General Electric Company, Niskayuna, NY (US)

( * ) Notice: Subject to any disclaimer, the term of this patent is extended or adjusted under 35 U.S.C. 154(b) by 752 days.

(21) Appl. No.: 13/307,740

(22) Filed: Nov. 30, 2011

(65) Prior Publication Data

US 2013/0138366 A1  May 30, 2013

(51) Int. Cl.
*G01R 31/00* (2006.01)
*H02H 7/26* (2006.01)
*H02H 3/30* (2006.01)
*G01R 31/08* (2006.01)

(52) U.S. Cl.
CPC ............... *H02H 7/261* (2013.01); *H02H 3/305* (2013.01); *G01R 31/086* (2013.01); *Y04S 10/522* (2013.01)

(58) Field of Classification Search
CPC ..... H02H 3/305; H02H 7/261; G01R 31/086; Y04S 10/522
USPC .................................................... 702/58, 60
See application file for complete search history.

(56) References Cited

U.S. PATENT DOCUMENTS

| 3,308,345 | A | * | 3/1967 | Van Cortlandt Warringto | 361/44 |
|---|---|---|---|---|---|
| 5,287,288 | A | * | 2/1994 | Brennen et al. | 702/58 |
| 5,488,532 | A | * | 1/1996 | Mrowiec et al. | 361/63 |
| 6,601,001 | B1 | | 7/2003 | Moore | |
| 7,489,138 | B2 | | 2/2009 | Yu et al. | |
| 2008/0077336 | A1 | * | 3/2008 | Fernandes | 702/57 |
| 2009/0187284 | A1 | * | 7/2009 | Kreiss et al. | 700/291 |
| 2010/0070213 | A1 | * | 3/2010 | Anklam | 702/60 |
| 2010/0133904 | A1 | * | 6/2010 | Klodowski et al. | 307/24 |
| 2011/0254517 | A1 | * | 10/2011 | Morishima et al. | 323/207 |

OTHER PUBLICATIONS

Jiang et al., "A Novel Adaptive PMU Based Transmission Line Relay: Design and EMTP Simulation Results", IEEE Power Engineering Review, vol. 22, Issue 7, pp. 61-61, Jul. 2002.

(Continued)

*Primary Examiner* — Janet Suglo
*Assistant Examiner* — Stephanie Bloss
(74) *Attorney, Agent, or Firm* — Nitin N. Joshi

(57) ABSTRACT

A system for distributing electrical current to a plurality of loads includes a first sensor coupled to an input of a protection zone for measuring a first current entering the protection zone, wherein the protection zone includes at least a portion of an electrical distribution feeder. The system also includes a second sensor coupled to an output of the protection zone for measuring a second current exiting the protection zone, and a processor coupled to the first sensor and to the second sensor. The processor is programmed to receive measurements representative of the first current and the second current, and calculate a reactive current differential of the protection zone based on the first current and the second current. The processor is also programmed to compare the reactive current differential with a fault threshold, and generate an error notification if the reactive current differential is greater than the fault threshold.

20 Claims, 4 Drawing Sheets

(56) References Cited

OTHER PUBLICATIONS

Cheung et al., "Network-Integrated Adaptive Protection for Feeders with Distributed Generations", IEEE Power and Energy Society General Meeting—Conversion and Delivery of Electrical Energy in the 21st Century, pp. 1-8, Jul. 20-24, 2008, Pittsburgh, Pennsylvania.

Hamlyn et al., "Adaptive Protection and Control Strategy for Interfacing Wind-Power Electricity Generators to Distribution Grids", IEEE Power and Energy Society General Meeting—Conversion and Delivery of Electrical Energy in the 21st Century, pp. 1-8, Jul. 20-24, 2008, Pittsburgh, Pennsylvania.

* cited by examiner

ELECTRIC DISTRIBUTION SYSTEM PROTECTION

BACKGROUND OF THE INVENTION

The present application relates generally to power distribution systems and, more particularly, to protection systems for electric distribution systems.

Known electric power grids typically include power generation plants, transmission and distribution lines, transformers, and other devices that facilitate electric power transmission, and power delivery. After electric power is generated in the generating plants, it is transmitted for extended distances through the high voltage transmission lines to subtransmission/distribution substations. Transmission lines usually operate at voltage levels between approximately 115 kilovolts (kV) and approximately 765 kV. At the subtransmission/distribution substations, transformers reduce the high voltage at which the power has been transmitted to sub-transmission voltage levels that range from approximately 46 kV to approximately 69 kV, or to distribution voltage levels that range from approximately 12 kV to approximately 34.5 kV. Power is then transmitted through a feeder to an end customer through an electric distribution system, and before it reaches the end customer, the voltage is decreased to approximately 120V/240V by a distribution transformer.

Most known electric distribution systems include a plurality of feeders coupled to the substation transformer. The electric distribution systems may also include at least one capacitor bank, at least one voltage regulator, and at least one distributed generation (DG) device, e.g., a diesel generator and a photovoltaic source. The feeder is divided into smaller units via bus-bars, disconnect switches, reclosers, sectionalizers, and fuses, wherein such smaller units are referred to as segments. Each segment may have any number of DG devices coupled thereto.

Therefore, typically, most known electric distribution systems include a plurality of segments with a plurality of DG devices coupled throughout the segments. In the event that a fault occurs on a segment, DG devices may contribute to the fault current along with the substation. This results in a bi-directional fault current, and traditional relays sensitive to current direction may not initiate protective actions within predetermined specifications. Another issue with connection of distributed generators is that it changes the fault current of the distribution system. In other words, when you connect a distributed generator to the distribution system it will contribute to the fault current based on the power it is generating. This can lead to a failure of protection systems to detect faults when there are high levels of distributed generation. Therefore, conventional/traditional protection schemes/systems can be difficult to coordinate.

BRIEF DESCRIPTION OF THE INVENTION

In one embodiment, a system for distributing electrical current to a plurality of loads is provided that includes a first sensor coupled to an input of a protection zone for measuring a first current entering the protection zone, wherein the protection zone includes at least a portion of an electrical distribution feeder. The system also includes a second sensor coupled to an output of the protection zone for measuring a second current exiting the protection zone, and a processor coupled to the first sensor and to the second sensor. The processor is programmed to receive measurements representative of the first current and the second current, and calculate a reactive current differential of the protection zone based on the first current and the second current. The processor is also programmed to compare the reactive current differential with a fault threshold, and generate an error notification if the reactive current differential is greater than the fault threshold.

In another embodiment, a controller for use in a power distribution system is provided. The controller includes a memory device configured to store measurements representative of a first current entering a protection zone within the power distribution system and measurements representative of a second current exiting the protection zone. The controller also includes a processor coupled to the memory device. The processor is programmed to receive measurements representative of the first current and the second current from said memory device, and calculate a reactive current differential of the protection zone based on the first current and the second current. The processor is also programmed to compare the reactive current differential with a fault threshold, and generate an error notification if the reactive current differential is greater than the fault threshold.

In yet another embodiment, a method for detecting a fault within a power distribution system is provided. The method includes receiving measurements representative of a first current entering a protection zone and a second current exiting the protection zone, and calculating a reactive current differential of the protection zone based on the first current and the second current. The method also includes comparing the reactive current differential with a fault threshold, and generating an error notification if the reactive current differential is greater than the fault threshold.

DETAILED DESCRIPTION OF THE INVENTION

Figure 1A:
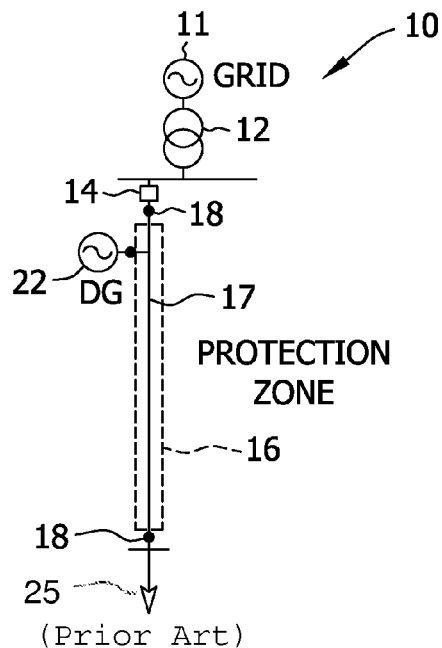
FIG. 1A is a schematic diagram of a typical conventional prior art radial distribution feeder circuit.

FIG. 1A is a schematic diagram of a typical conventional prior art radial distribution feeder circuit 10. Feeder circuit 10 is coupled to a portion of an electric power grid 11 that supplies electric power to a transmission and distribution substation 12. Electric power from substation 12 is then fed to various loads (not shown) through a feeder 17 including a plurality of power circuit breakers and/or recloser devices 14. Feeder 17 is divided into a plurality of protection zones 16 that are at least partially defines by breakers/devices 14 and electrical measurement devices 18 that include current transformers and voltage transformers. Breakers/devices 14 may be operated by an instantaneous and time overcurrent protection device such as an overcurrent relay (not shown) used to facilitate fault detection. In some embodiments, there may be multiple other overcurrent protection devices along radial distribution feeder circuit 10 that are time coordinated so that the device closest to the fault will trip the fastest. Also, in some embodiments, if a timed overcurrent scheme is applied, the settings of the overcurrent relay are such that for higher fault currents, the relay trips the recloser earlier as compared to lower fault currents. A distributed generator (DG) 22 may also be connected to feeder circuit 10. For illustrative purposes, a fault 25 is shown occurring on feeder circuit 10 within protection zone 16 downstream of DG 22.

Figure 1B:
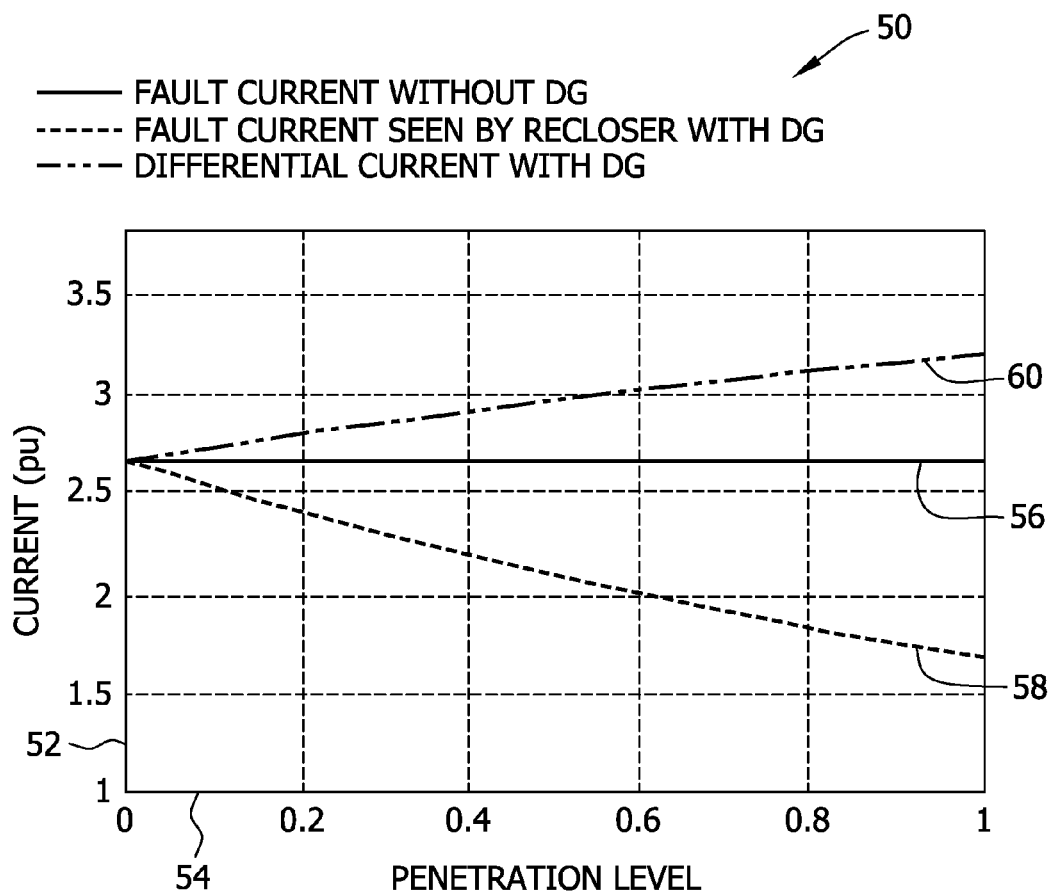
FIG. 1B is a graphical view, i.e., a graph of electric currents as a function of distributed generation penetration.

FIG. 1B is a graphical view, i.e., a graph 50 of electric currents as a function of distributed generation penetration. Graph 50 includes a y-axis 52 that represents per-unit (pu) values of the current rating of feeder 17 (shown in FIG. 1A) extending from 1.0 pu to 3.5 pu in increments of 0.5 pu. Graph 50 also includes an x-axis 54 that represents the penetration level of DGs 22 (shown in FIG. 1A) extending from 0.0 to 1.0 in increments of 0.2. As used herein, the term "penetration level" refers to the ratio of the amount of DG-generated electric power injected into feeder 17 to the capacity of feeder 17, wherein the units of penetration level are dimensionless.

Referring to FIGS. 1A and 1B together, fault 25 occurs as shown in FIG. 1A. Since DG 22 is coupled to feeder 17 downstream of the overcurrent relay associated with breaker/device 14, and assuming DG 22 is generating and transmitting electric current into feeder 17, the overcurrent relay will sense a current value lower than the value associated with fault 25. For illustration, in FIG. 1B, a first curve 56 shows the fault current as sensed by the overcurrent relay without the current injected by DG 22. Therefore, first curve 56 is substantially constant with respect to penetration level. A second curve 58 shows the fault current as sensed by the overcurrent relay with the current injected by DG 22 increasing with penetration level. Therefore, the actual fault current sensed by the feeder relay decreases as the penetration level increases. Generally, when an overcurrent relay senses a smaller current than the actual fault current that is being fed at least partially by DG devices, a delay in response by the overcurrent relay may result, an effect sometimes referred to as "blinding of protection."

A third curve 60 in FIG. 1B shows the differential current values when electric current is measured at electrical measurement devices 18 at each end of protection zone 16. As the penetration levels of DG 22 increase, the differential current values increase as well. Therefore, while the overcurrent relay may sense a decreasing current as a function of increasing penetration levels of DG 22, differential current values maintain a high value and even increase with penetration level, thereby providing a measureable characteristic of feeder 17 having a good sensitivity.

Thus, the exemplary systems and methods described herein overcome disadvantages of known protection and control systems for electric distribution systems with distributed generation by determining a current differential between two ends of a feeder segment using precisely synchronized current measurements. Specifically, the protection and control systems only respond directly to differences in the currents entering and leaving the associated segment and provides bi-directional fault current sensing that is synchrophasor-based. Therefore, such protection and control systems are substantially insensitive to changes in fault current levels and load flow changes due to distributed generation devices coupled to the distribution system. However, such protection and control systems are sensitive to different fault impedances. Also, such protection and control systems identify affected segments quickly and accurately, and therefore facilitate an improved probability of operating the protective device that will most likely clear the fault while reducing electric power disruptions. Such operational discrimination of the associated reclosers decreases miscoordination of reclosers, fuses, and other protective devices. Moreover, by extending segmented protection and control on a segment-by-segment basis across the feeders, such protection and control systems facilitate wide-area differential protection across large portions of an electric distribution system.

Figure 2:
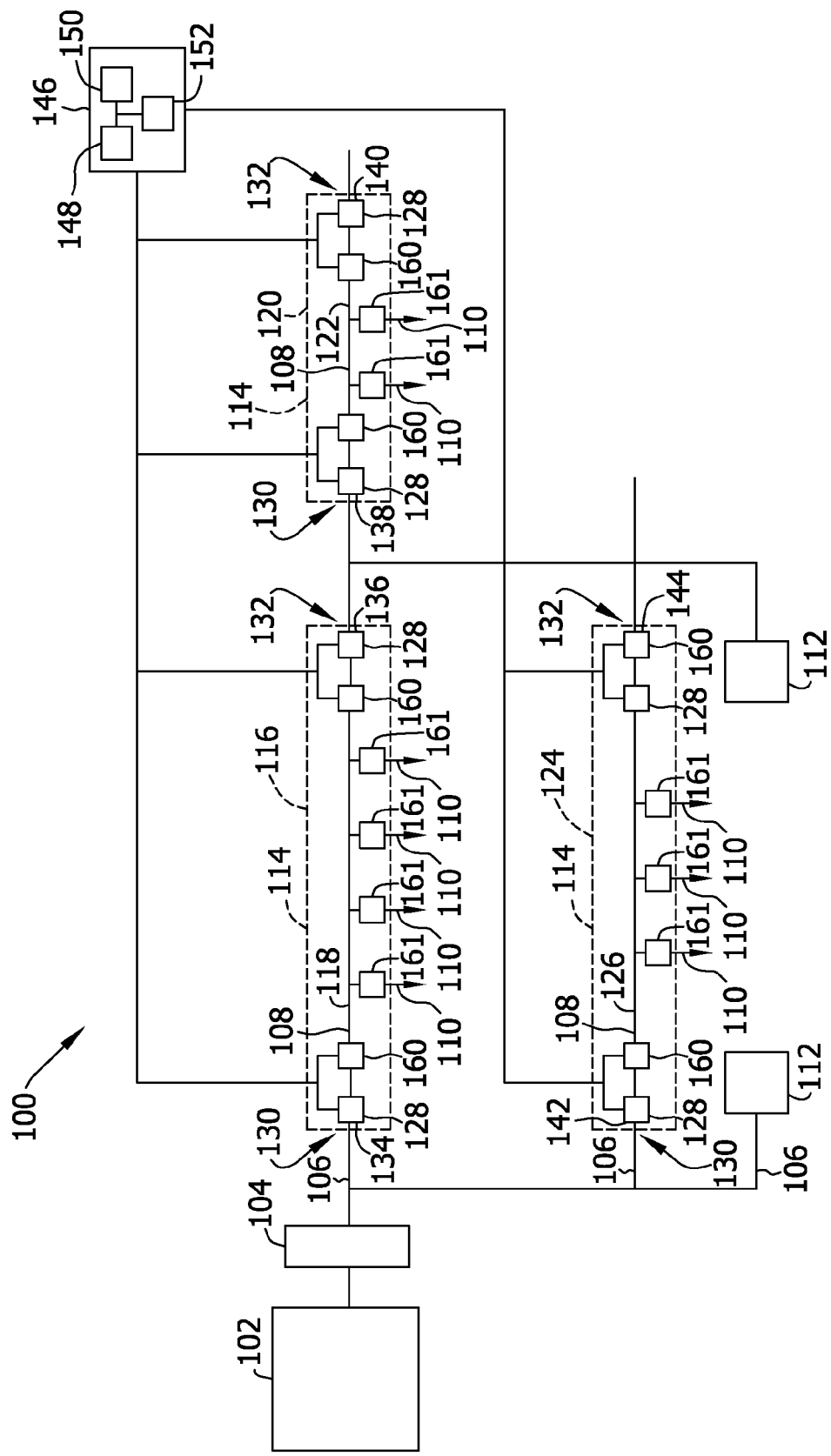
FIG. 2 is a schematic block diagram of an exemplary power distribution system.

FIG. 2 is a schematic block diagram of an exemplary power distribution system 100 that may be used to distribute electrical power to a plurality of loads (not shown). In the exemplary embodiment, system 100 includes at least one alternating current (AC) power source 102 that generates electrical power (i.e., voltage and current). AC power source 102 is coupled to a distribution transformer 104 that adjusts the voltage and/or current received from AC power source 102. Distribution transformer 104 may be positioned within a substation (not shown) or within any other location that enables system 100 to function as described herein.

A plurality of electrical distribution feeders 106 are coupled to distribution transformer 104 for distributing the AC voltage and current to a plurality of loads (not shown) coupled to each feeder 106. In the exemplary embodiment, each feeder 106 includes at least one section 108, and each feeder section 108 may include a load tap 110. In addition, one or more distributed generators or secondary electrical power generation units 112, such as one or more photovoltaic (PV) arrays or plants, are coupled to feeders 106 and/or segments 108.

In the exemplary embodiment, each load tap 110 provides AC voltage and current to one or more loads coupled to load tap 110. In one embodiment, an intermediate transformer (not shown), such as a "pole transformer," is coupled to load tap 110 and to one or more loads to provide a "stepped down" AC voltage to the loads.

In the exemplary embodiment, a protection zone 114 is defined for each section 108. Each protection zone 114 may be defined to include an entire section 108 or one or more portions of section 108. For example, a first protection zone 116 is defined for a first section 118, a second protection zone 120 is defined for a second section 122, and a third protection zone 124 is defined for a third section 126. Alternatively, any number of protection zones 114 may be defined for one or more sections 108 and/or for any other portion of power distribution system 100. Isolation devices 160 disconnect one section from another section, and include, without limitation, reclosers, circuit breakers, and fuses and their respective relays.

A current flowing into, or entering, each protection zone 114 and/or section 108 and a current flowing out, or exiting, of each protection zone 114 and/or section 108 is measured by a respective monitoring sensor 128. More specifically, a monitoring sensor 128 is coupled to an input portion 130 of each section 108 and/or protection zone 114 for measuring the current flowing into protection zone 114 and/or section 108. Monitoring sensor 128 may also measure a voltage at the input portion 130. A monitoring sensor 128 is also coupled to an output portion 132 of section 108 and/or protection zone 114 for measuring the current flowing out of protection zone 114 and/or section 108. In the exemplary embodiment, monitoring sensors 128 may be synchronized phasor measurement devices (synchrophasors), e.g., phasor measurement units (PMUs) that measure the amplitude and phase of the current as well as voltage. In another embodiment, monitoring sensors 128 may include current sensors and voltage sensors coupled to an intelligent electronic device (IED).

Accordingly, in the exemplary embodiment, a first input monitoring sensor 134 measures a current entering first section 118 and/or first protection zone 116, and a first output monitoring sensor 136 measures a current flowing out from first section 118 and/or first protection zone 116. A second input monitoring sensor 138 measures a current entering second section 122 and/or second protection zone 120, and a second output monitoring sensor 140 measures a current flowing out from second section 122 and/or second protection zone 120. In addition, a third input monitoring sensor 142 measures a current entering third section 126 and/or third protection zone 124, and a third output monitoring sensor 144 measures a current flowing out from third section 126 and/or third protection zone 124.

In the exemplary embodiment, a central controller 146 controls and/or monitors an operation of power distribution system 100. More specifically, monitoring sensors 128 are coupled to central controller 146, and signals representative of current and voltage measurements from monitoring sensors 128 are transmitted to central controller 146 for analyzing the measurements. In one embodiment, central controller 146 may also receive load current information from signal sensors 161 located on load taps 110. Central controller 146 calculates a current differential for each protection zone 114 and/or feeder section 108 (or any other portion of power distribution system 100) as described more fully herein.

Central controller 146 further controls isolation devices 160 based on the current differential i.e., it may send a control signal to open isolation devices 160 of a particular section to isolate it from rest of the network. The current differential value may be a partial current differential value or a total current differential value. The total current differential value is determined by subtracting all the load current values received from signal sensors 161 from the input current and further subtracting it from the output current. The partial current differential value is same as the total current differential value but only with partial load current values subtracted from the input current rather than all the load current values. In one embodiment, when the partial current differential value is to be determined central controller 146 estimates the current flowing to the some or all of the load taps and also determines the difference between the reactive current rather than the overall current. As will be appreciated by those skilled in the art, reactive current may be defined as a component of the current perpendicular to the voltage, which contributes no power but increases the power losses of the system. The reactive current may either be measured directly or can also be computed based on phase values.

Table 1 provides an example illustrating how central controller 146 utilizes partial current differential. In table 1, I_in refers to input current of a particular section and I_out refers to output current of that section. During normal condition, the difference between total current (i.e., reactive as well as active current) I_in and I_out is 0.3 pu whereas the difference between reactive current I_in and I_out is 0.06 pu. However, when there is fault in the section, the total current difference jumps to 12 pu whereas the reactive current difference jumps to 8.47 pu. Central controller 146 then compares this current difference with a threshold and determines whether there is fault or not.

TABLE 1

| | Normal Condition | | Internal Fault | |
| --- | --- | --- | --- | --- |
| | Total Current (pu) | Reactive Current (pu) | Total Current (pu) | Reactive Current (pu) |
| I_in | 1 | 0.2 | 10 | 7.07 |
| I_out | 0.7 | 0.14 | −2 | −1.4 |
| I_in − I_out | 0.3 | 0.06 | 12 | 8.47 |

In the exemplary embodiment, central controller 146 includes at least one processor 148, at least one memory device 150, and at least one communication device 152. Processor 148 includes any suitable programmable circuit including one or more systems and microcontrollers, microprocessors, reduced instruction set circuits (RISC), application specific integrated circuits (ASIC), programmable logic circuits (PLC), field programmable gate arrays (FPGA), and any other circuit capable of executing the functions described herein. The above examples are exemplary only, and thus are not intended to limit in any way the definition and/or meaning of the term "processor."

Memory device 150 includes a computer readable storage medium, such as, without limitation, random access memory (RAM), flash memory, a hard disk drive, a solid state drive, a flash drive, a compact disc, a digital video disc, and/or any suitable memory. In the exemplary embodiment, memory device 150 includes data and/or instructions that are executable by processor 148 (i.e., processor 148 is programmed by the instructions) to enable processor 148 to perform the functions described herein.

Communication device 152 includes, without limitation, a network interface controller (NIC), a network adapter, a transceiver, a public switched telephone network (PSTN) interface controller, and/or any other communication device that enables central controller 146 to operate as described herein. Communication device 152 is communicatively coupled to monitoring sensors 128 using any suitable conduit and/or is communicatively coupled to monitoring sensors 128 wirelessly for receiving current measurements from sensors 128. In addition, communication device 152 is communicatively coupled to one or more current isolation devices 160, such as one or more relays, fuses, or circuit breakers, to enable central controller 146 to electrically disconnect one or more feeders 106, sections 108, and/or loads from AC power sources 102 and/or secondary power generation units 112 if a fault is detected within power distribution system 100.

During operation, AC power source 102 generates electrical power. The electrical power is transmitted to distribution transformer 104 that adjusts the voltage and/or current received from AC power source 102. For example, a load tap changer (not shown) adjusts a tap position of distribution transformer 104 to controllably reduce, or "step down," the voltage received from AC power source 102.

The adjusted voltage and current is transmitted through feeders 106 and feeder sections 108, and the voltage and current are distributed to the loads through respective load taps 110. Monitoring sensors 128 measure the current amplitude and/or phase flowing into and/or out of each protection zone 114 and/or section 108, and sensors 128 transmit the current measurements to central controller 146.

In the exemplary embodiment, central controller 146 analyzes the current measurements and calculates a reactive current differential for each protection zone 114 and/or feeder section 108. In one embodiment, the reactive current differential is calculated by subtracting the amount of current flowing out of protection zone 114 and/or section 108 from the amount of current flowing into protection zone 114 and/or section 108. In one embodiment, central controller determines reactive current differential by further subtracting load current values of all or partial load taps 110 from the difference of reactive current of incoming and outgoing current. Accordingly, central controller 146 subtracts the reactive current measurement of first output monitoring sensor 136 from the reactive current measurement of first input monitoring sensor 134 and optionally further subtracts reactive current measurement from all or some signal sensors 161 to determine the reactive current differential of first protection zone 116 and/or first section 118. In a similar manner, central controller 146 calculates the reactive current differential of second protection zone 120 and/or second section 122 using reactive current measurements of second input monitoring sensor 138, second output monitoring sensor 140, and signal sensor 161 and calculates the reactive current differential of third protection zone 124 and/or third section 126 using reactive current measurements of third input monitoring sensor 142, third output monitoring sensor 144 and signal sensor 161. Central controller 146 stores the reactive current measurements and/or the calculated reactive current differentials in memory device 150. In one embodiment, central controller 146 may estimate the reactive current flowing to the loads (through load taps 110) using the current measurements received from monitoring sensors 128.

Central controller 146 compares the calculated reactive current differentials with a fault threshold, as described herein, to determine whether a fault has occurred or exists within power distribution system 100. In the exemplary embodiment, if central controller 146 detects that the reactive current differential exceeds a fault threshold, central controller 146 determines that a fault exists and disables the distribution of voltage and/or current to the feeders 106, sections 108, and/or the loads that are affected by the fault by opening isolation devices 160.

In some embodiments, distribution transformers may induce a backfed inrush of current that may have a magnitude approximately ten times greater than normal operating current, such current magnitude at least partially dependent upon the voltage of the section that transformer is coupled to. Such backfeeding typically only lasts approximately one to three seconds prior to decreasing to normal levels. In such a case, central controller 146 determines a magnitude or amount of a second harmonic current present in protection zone 114 (e.g., in the current differential and/or in the input current and/or the output current). If the magnitude of the second harmonic current exceeds a predetermined harmonic current threshold, processor 148 determines that transformer in-rush current is being introduced into protection zone 114, thus producing at least a portion of the current differential. However, if the magnitude of the second harmonic current does not exceed the predetermined harmonic current threshold, processor 148 determines fault exists in the section.

Figure 3:
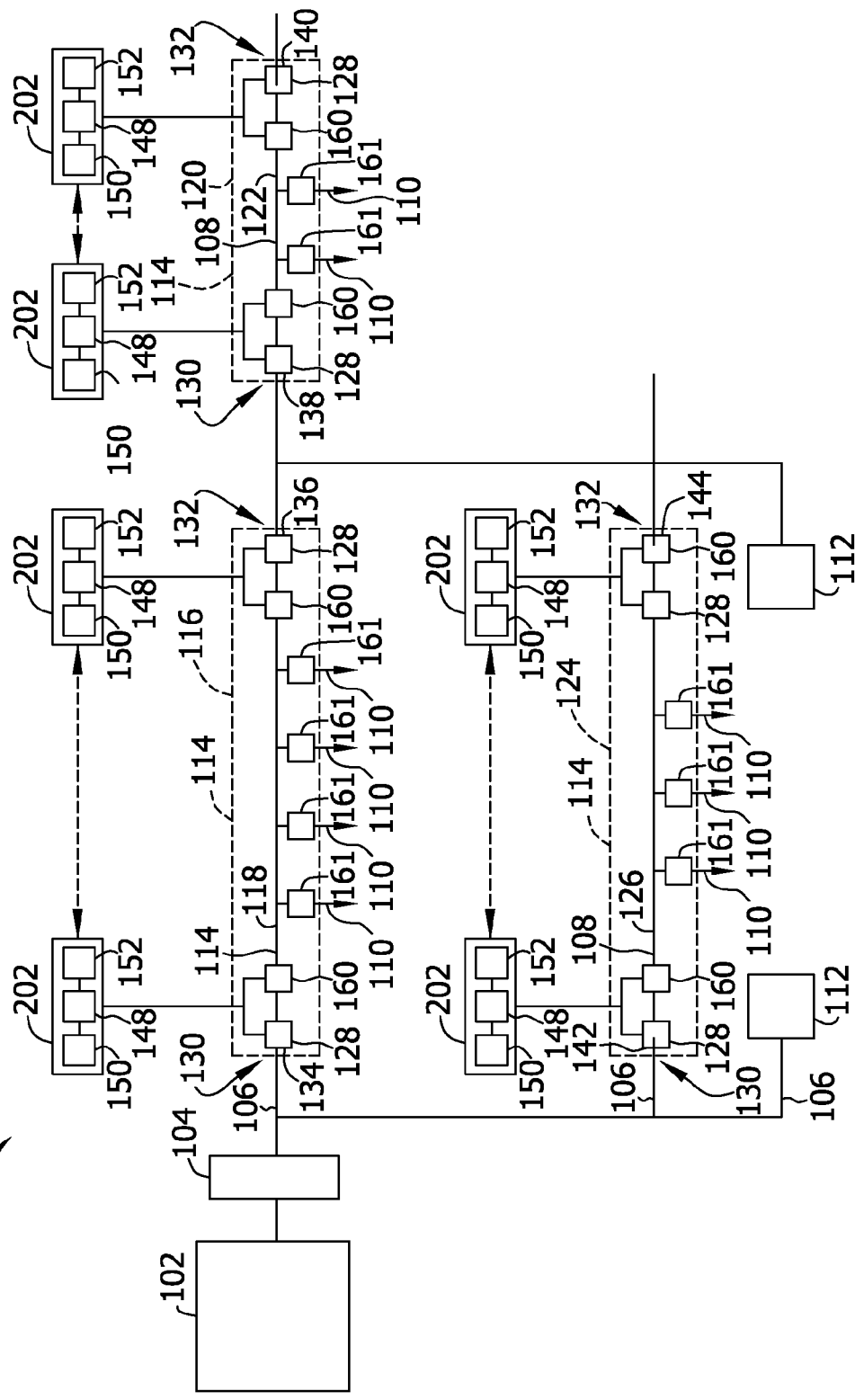
FIG. 3 is a schematic block diagram of another exemplary power distribution system.

FIG. 3 is a schematic block diagram of another exemplary power distribution system 200 that may be used to distribute electrical power to a plurality of loads (not shown). Unless otherwise specified, power distribution system 200 is similar to power distribution system 100 (shown in FIG. 2), and similar components are labeled in FIG. 3 with the same reference numerals used in FIG. 2.

In the exemplary embodiment, power distribution system 200 does not include central controller 146 (shown in FIG. 2). Rather, power distribution system 200 is controlled and/or monitored in a distributed manner by a plurality of local controllers 202. In the exemplary embodiment, each local controller 202 includes a processor 148, a memory device 150, and a communication device 152. In addition, each local controller 202 is coupled to a monitoring sensor (or PMU) 128.

Monitoring sensors 128 are coupled to processors 148 of respective local controllers 202, and signals representative of current measurements from monitoring sensors 128 are transmitted to processors 148 for analyzing the measurements. In addition, local controllers 202 transmit current measurements (using communication device 152) to each other local controller 202 coupled to the same protection zone 114, feeder 106, and/or feeder section 108. Each local controller 202 stores the current measurements in a respective memory device 150. Each processor 148 calculates a current differential for each protection zone 114 and/or feeder section 108 (or any other portion of power distribution system 200) using current measurements received from monitoring sensors 128 and/or from other local controllers 202. In other respects, power distribution system 200 operates substantially similarly to power distribution system 100.

Figure 4:
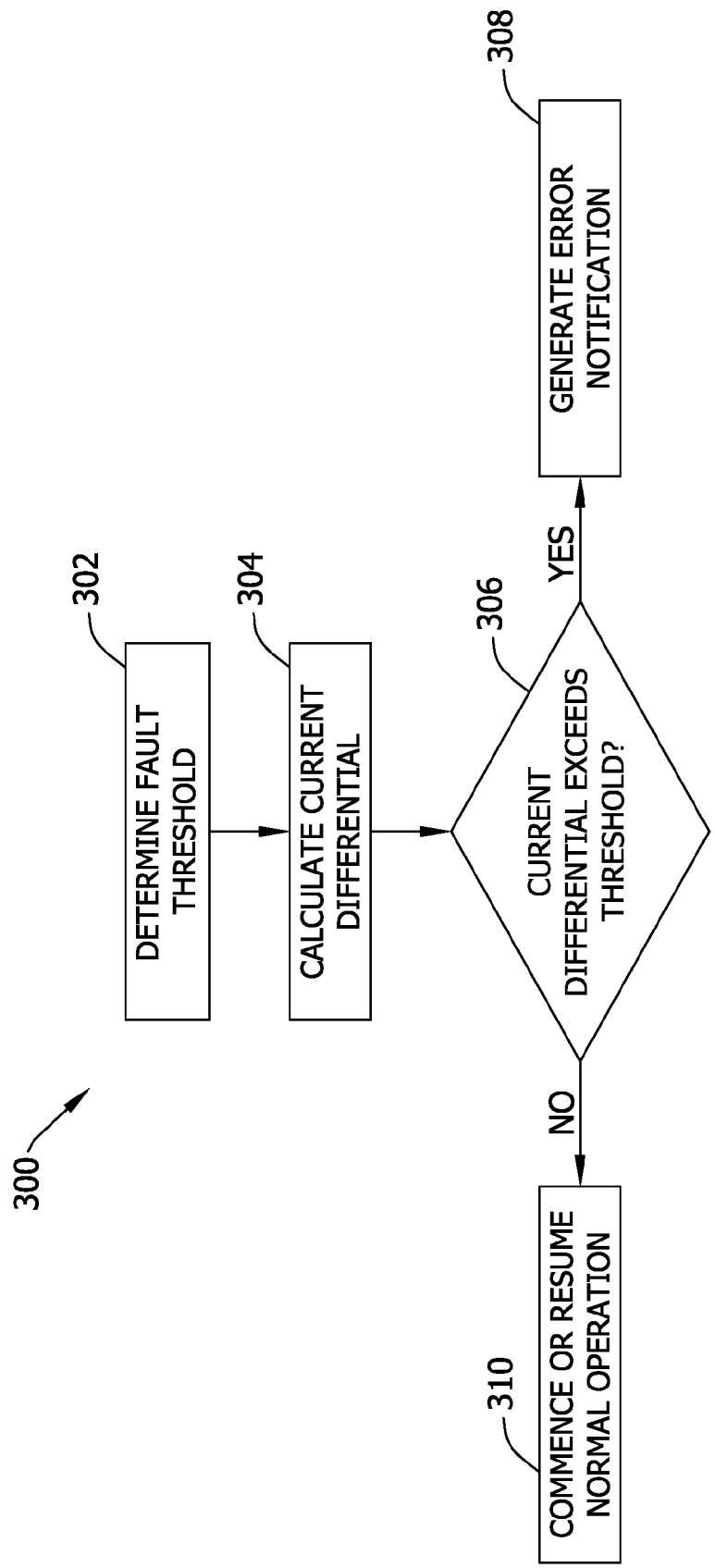
FIG. 4 is a flow diagram of an exemplary method of detecting a fault that may be used with the power distribution system shown in FIG. 2 or FIG. 3.

FIG. 4 is a flow diagram of an exemplary method 300 of detecting a fault that may be used with power distribution system 100 (shown in FIG. 2) and/or power distribution system 200 (shown in FIG. 3). In the exemplary embodiment, method 300 is embodied within a plurality of computer-executable instructions stored within memory device 150 of central controller 146 (both shown in FIG. 2) and/or within memory device 150 of each local controller 202 (shown in FIG. 3). In addition, method 300 is executed by processor 148 (shown in FIG. 2) of central controller 146 and/or by processor 148 of each local controller 202.

In the exemplary embodiment, method 300 includes determining 302 a fault threshold. More specifically, processor 148 of central controller 146 and/or each processor 148 within each local controller 202 determines 302 the fault threshold to be a predetermined value of reactive current that is above a normal operating value of the current within protection zone 114 (shown in FIG. 2) and/or above an amount of reactive current or a maximum amount of reactive current flowing through one or more load taps 110 (shown in FIG. 1) within protection zone 114. In one embodiment, the fault threshold is adjustable or configurable based on input received from a user and/or another device. In another embodiment, the fault threshold is a percentage of, or is proportional to, the magnitude of the current within protection zone 114 and/or the current flowing through one or more load taps 110. In yet another embodiment, the fault threshold is a combination of the aforementioned algorithms such that the fault threshold is equal to the fixed, or predetermined, value until the current flowing through protection zone 114 and/or load taps 110 reaches a first amount of current, and is equal to a percentage of the current flowing through protection zone 114 and/or load taps 110 if the first amount of reactive current is exceeded. Alternatively, the fault threshold may be determined 302 to be any other value that enables method 300 to function as described herein.

A reactive current differential is calculated 304 by processor 148 after receiving measurements from one or more monitoring sensors 128 and/or processors 148, such as processors 148 of local controllers 202. More specifically, the reactive current (hereinafter referred to as the "input reactive current") is measured at an input of protection zone 114, such as at input portion 130 (shown in FIG. 2). The reactive current (hereinafter referred to as the "output reactive current") is also measured at an output of protection zone 114, such as at output portion 132. The reactive current differential is calculated 304 by subtracting the output reactive current from the input reactive current.

If processor 148 determines 306 that the current differential exceeds the fault threshold, a fault condition is detected and processor 148 generates 308 an error notification, signal, and/or message, and/or another notification that is transmitted to a user, device (e.g., isolation device), and/or system such that corrective action may be taken. In some embodiments to avoid false detection of faults, when the current differential (i.e., a first value of the current differential) exceeds a predetermined threshold, processor 148 waits a predetermined amount of time and calculates a second value for the current differential based on a second set of measurements received from monitoring sensors 128 and/or processors 148. In the exemplary embodiment, the predetermined amount of time is equal to about 3 cycles of the input current and/or the output current. Alternatively, the predetermined amount of time may be any other amount of time that enables method 300 to function as described herein. If the second value of the current differential is less than the first value of the current differential, or is less than the first value by a predetermined amount, processor 148 determines 306 that the current differential exceeded the threshold for some other reason than a fault condition. For example, a reduction of the magnitude of the current differential within about 3 cycles may indicate that a motor is backfeeding current into protection zone 114, thus producing at least a portion of the current differential. However, if the second value of the current differential is not less than the first value, or is not less than the first value by the predetermined amount, processor 148 determines that a fault exists in the system.

As another example, to avoid false detection of fault due to transformer inrush current, processor 148 determines a magnitude or amount of a second harmonic current present in protection zone 114 (e.g., in the current differential and/or in the input current and/or the output current). If the magnitude of the second harmonic current exceeds a predetermined harmonic current threshold, processor 148 indicates that transformer in-rush current is being introduced into protection zone 114, thus producing at least a portion of the current differential. However, if the magnitude of the second harmonic current does not exceed the predetermined harmonic current threshold, processor 148 determines that a fault exists in the system.

In the exemplary embodiment, if processor 148 determines that a fault exists in the system, processor 148 generates 308 an error notification, signal, and/or message, and/or another notification that is transmitted to a user, device, and/or system such that corrective action may be taken, as described above. Additionally or alternatively, processor 148 transmits a signal to an isolation device 160 (shown in FIG. 2) such as a relay, circuit breaker, and/or another circuit protection device to interrupt the current from being supplied to protection zone 114 and/or segment 108. However, if the current differential does not exceed the fault threshold, processor 148 refrains from generating the error notification and commences 310 or resumes normal operation of the system.

A technical effect of the systems and methods described herein includes (a) receiving measurements representative of a first current entering a protection zone and a second current exiting the protection zone; (b) calculating a reactive current differential of a protection zone based on a first current and a second current; (c) comparing a reactive current differential with a fault threshold; and (d) generating an error notification if a reactive current differential is greater than a fault threshold.

The above-described embodiments provide efficient and cost-effective methods and systems for detecting a fault within a power distribution system. A processor receives a measurement of a first amount of current entering a protection zone and receives a measurement of a second amount of current exiting the protection zone. The processor calculates a current differential within the protection zone by subtracting the measured first amount of current from the measured second amount of current and by subtracting an amount of current transmitted to one or more loads. The processor compares the current differential with a fault threshold. The fault threshold may be a fixed threshold, an adjustable threshold, or a threshold that is at least partially proportional to the current differential. If the current differential exceeds the fault threshold, the processor generates an error notification indicating that a fault condition has been detected. Accordingly, the embodiments described herein use a small number of sensors to detect fault conditions. In addition, the embodiments use a current differential to detect fault conditions such that the fault conditions may be detected even if variable amounts of current are present within the protection zones.

Exemplary embodiments of methods and systems for use in detecting a fault are described above in detail. The methods and systems are not limited to the specific embodiments described herein, but rather, components of the systems and/or steps of the methods may be utilized independently and separately from other components and/or steps described herein. For example, the methods may also be used in combination with other power systems and methods, and are not limited to only being used with the power distribution systems described herein. Accordingly, the exemplary embodiment can be implemented and utilized in connection with many other power applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A system for distributing electrical current to a plurality of loads, said system comprising:
    a first sensor coupled to an input of a protection zone for measuring a first current entering the protection zone, wherein the protection zone includes at least a portion of an electrical distribution feeder;
    a second sensor coupled to an output of the protection zone for measuring a second current exiting the protection zone; and
    a processor coupled to said first sensor and to said second sensor, said processor programmed to:
        receive measurements representative of the first current and the second current;
        calculate a reactive current differential of the protection zone based on the first current and the second current;
        compare the reactive current differential with a fault threshold; and
        generate an error notification if the reactive current differential is greater than the fault threshold.

2. A system in accordance with claim 1, wherein the electrical distribution feeder includes a plurality of load taps.

3. A system in accordance with claim 2, wherein said processor is programmed to calculate the reactive current differential of the protection zone based on the first current, the second current, and a current provided to the plurality of load taps.

4. A system in accordance with claim 1, wherein said processor is programmed to determine whether a fault exists within said system by:
   determining a first reactive current differential value;
   waiting for a predetermined time to elapse; and
   determining a second reactive current differential value.

5. A system in accordance with claim 4, wherein said processor is further programmed to determine that a fault exists within said system if the first reactive current differential value is greater than the fault threshold and if the second reactive current differential value is not less than the first reactive current differential value.

6. A system in accordance with claim 1, wherein said processor is further programmed to determine whether a fault exists within said system by determining a magnitude of a second harmonic current within the protection zone.

7. A system in accordance with claim 6, wherein said processor is further programmed to determine that a fault exists if the reactive current differential is greater than the fault threshold and if the magnitude of the second harmonic current does not exceed a predetermined harmonic current threshold.

8. A controller for use in a power distribution system, said controller comprising:
   a memory device configured to store measurements representative of a first current entering a protection zone within the power distribution system and measurements representative of a second current exiting the protection zone; and
   a processor coupled to said memory device, said processor programmed to:
      receive measurements representative of the first current and the second current from said memory device;
      calculate a reactive current differential of the protection zone based on the first current and the second current;
      compare the reactive current differential with a fault threshold; and
      generate an error notification if the reactive current differential is greater than the fault threshold.

9. A controller in accordance with claim 8, wherein the protection zone includes a plurality of load taps, said processor is further programmed to calculate the reactive current differential based on the first current, the second current, and a current provided to the plurality of load taps.

10. A controller in accordance with claim 8, wherein said processor is further programmed to determine whether a fault exists within the power distribution system based on the reactive current differential.

11. A controller in accordance with claim 10, wherein said processor is further programmed to determine whether the fault exists by:
   determining a first reactive current differential value;
   waiting for a predetermined time to elapse; and
   determining a second reactive current differential value.

12. A controller in accordance with claim 11, wherein said processor is further programmed to determine that the fault exists if the first reactive current differential value is greater than the fault threshold and if the second reactive current differential value is not less than the first reactive current differential value.

13. A controller in accordance with claim 10, wherein said processor is further programmed to determine whether the fault exists by determining a magnitude of a second harmonic current within the protection zone.

14. A controller in accordance with claim 13, wherein said processor is further programmed to determine that a fault exists if the reactive current differential is greater than the fault threshold and if the magnitude of the second harmonic current does not exceed a predetermined harmonic current threshold.

15. A method for detecting a fault within a power distribution system, said method comprising:
   receiving measurements representative of a first current entering a protection zone and a second current exiting the protection zone;
   calculating a reactive current differential of the protection zone based on the first current and the second current;
   comparing the reactive current differential with a fault threshold;
   generating an error notification if the reactive current differential is greater than the fault threshold; and
   opening isolation devices to disable the distribution of a voltage and a current to a section of the power distribution system.

16. A method in accordance with claim 15, wherein the protection zone includes a plurality of load taps, said method calculates the reactive current differential based on the first current, the second current, and a current provided to the plurality of load taps.

17. A method in accordance with claim 15, further comprising determining whether a fault exists within the power distribution system based on the reactive current differential.

18. A method in accordance with claim 17, wherein said determining whether a fault exists comprises:
   determining a first reactive current differential value;
   waiting for a predetermined time to elapse; and
   determining a second reactive current differential value.

19. A method in accordance with claim 18, further comprising determining that a fault exists if the first reactive current differential value is greater than the fault threshold and if the second reactive current differential value is not less than the first reactive current differential value.

20. A method in accordance with claim 17, wherein said determining whether a fault exists comprises:
   determining a magnitude of a second harmonic current within the protection zone; and
   determining whether the magnitude of the second harmonic current exceeds a predetermined harmonic current threshold.

* * * * *